(12) United States Patent
Kobrin

(10) Patent No.: US 8,425,789 B2
(45) Date of Patent: Apr. 23, 2013

(54) METHOD AND APPARATUS FOR ANISOTROPIC ETCHING

(75) Inventor: Boris Kobrin, Dublin, CA (US)

(73) Assignee: Rolith, Inc., Pleasanton, CA (US)

( * ) Notice: Subject to any disclaimer, the term of this patent is extended or adjusted under 35 U.S.C. 154(b) by 568 days.

(21) Appl. No.: 12/587,078

(22) Filed: Oct. 1, 2009

(65) Prior Publication Data

US 2010/0173494 A1    Jul. 8, 2010

Related U.S. Application Data

(63) Continuation-in-part of application No. PCT/US2008/006355, filed on May 17, 2008.

(60) Provisional application No. 60/933,989, filed on Jun. 9, 2007.

(51) Int. Cl.
*B44C 1/22* (2006.01)

(52) U.S. Cl.
USPC ............ 216/46; 216/37; 216/41; 216/48; 216/58; 216/67; 216/83; 438/689; 438/694; 438/695; 438/696; 438/700; 438/706; 438/712; 438/745

(58) Field of Classification Search ............ None
See application file for complete search history.

(56) References Cited

U.S. PATENT DOCUMENTS

| | | | |
|---|---|---|---|
| 5,223,085 A * | 6/1993 | Kawai et al. .......... 216/67 |
| 5,501,893 A | 3/1996 | Laermer et al. |
| 5,637,180 A * | 6/1997 | Gosain et al. .......... 156/345.47 |
| 5,767,021 A * | 6/1998 | Imai et al. .......... 438/719 |
| 5,928,815 A | 7/1999 | Martin |
| 6,040,243 A * | 3/2000 | Li et al. .......... 438/687 |

(Continued)

FOREIGN PATENT DOCUMENTS

| AU | 2005213499 | 8/2005 |
| CA | 2558623 | 8/2005 |

(Continued)

OTHER PUBLICATIONS

Chen et al., J. Microelectrochemical Systems, vol. 11, No. 3, 2002, pp. 264-275.*

(Continued)

*Primary Examiner* — Lan Vinh
*Assistant Examiner* — Jiong-Ping Lu
(74) *Attorney, Agent, or Firm* — Joshua D. Isenberg; JDI Patent

(57) ABSTRACT

In anisotropic etching of the substrates, ultra-thin and conformable layers of materials can be used to passivate sidewalls of the etched features. Such a sidewall passivation layer may be a Self-assembled monolayer (SAM) material deposited in-situ etching process from a vapor phase. Alternatively, the sidewall passivation layer may be an inorganic-based material deposited using Atomic Layer Deposition (ALD) method. SAM or ALD s layer deposition can be carried out in a pulsing regime alternating with sputtering and/or etching processes using process gasses with or without plasma. Alternatively, SAM deposition is carried out continuously, while etch or sputtering turns on in a pulsing regime. Alternatively, SAM deposition and etch or sputtering may be carried out continuously. Both types of suggested passivation materials give advantage over state-of-the-art methods in ability to carefully control thickness and uniformity of the layers, thus enable anisotropic etching process for high aspect ratio nano-size features.

17 Claims, 2 Drawing Sheets

U.S. PATENT DOCUMENTS

| | | | |
|---|---|---|---|
| 6,274,294 | B1 | 8/2001 | Hines |
| 6,518,168 | B1 | 2/2003 | Clem et al. |
| 6,770,416 | B2 | 8/2004 | Figov |
| 7,144,539 | B2 | 12/2006 | Olsson |
| 7,170,666 | B2 | 1/2007 | Piehl et al. |
| 7,208,788 | B2 | 4/2007 | Hiroshima et al. |
| 7,580,111 | B2 | 8/2009 | Miyamatsu et al. |
| 7,682,540 | B2 | 3/2010 | Boyan et al. |
| 2002/0079487 | A1* | 6/2002 | Ramanath et al. ............. 257/40 |
| 2003/0129545 | A1 | 7/2003 | Kik |
| 2003/0181034 | A1* | 9/2003 | Jiang et al. ................... 438/638 |
| 2003/0211341 | A1 | 11/2003 | Buchwalter et al. |
| 2004/0163758 | A1 | 8/2004 | Kagan et al. |
| 2004/0224256 | A1 | 11/2004 | Figov |
| 2004/0257629 | A1 | 12/2004 | Noehte et al. |
| 2005/0196452 | A1 | 9/2005 | Boyan et al. |
| 2005/0202185 | A1 | 9/2005 | Greengard et al. |
| 2005/0224452 | A1 | 10/2005 | Spiess et al. |
| 2005/0227492 | A1* | 10/2005 | Hah et al. ...................... 438/696 |
| 2006/0003577 | A1* | 1/2006 | Sone ............................. 438/638 |
| 2006/0014108 | A1 | 1/2006 | Ito et al. |
| 2006/0072295 | A1 | 4/2006 | Gotzen |
| 2007/0138699 | A1 | 6/2007 | Wuister et al. |
| 2007/0172746 | A1 | 7/2007 | Hiroshima et al. |
| 2007/0200276 | A1 | 8/2007 | Mackey et al. |
| 2009/0269705 | A1 | 10/2009 | Kobrin |
| 2009/0297989 | A1 | 12/2009 | Kobrin |
| 2009/0305513 | A1 | 12/2009 | Kobrin |
| 2010/0035163 | A1 | 2/2010 | Kobrin |
| 2010/0123885 | A1 | 5/2010 | Kobrin |
| 2010/0173494 | A1 | 7/2010 | Kobrin |
| 2011/0210480 | A1 | 9/2011 | Kobrin |

FOREIGN PATENT DOCUMENTS

| | | | |
|---|---|---|---|
| CN | 1735965 | | 2/2006 |
| CN | 1943013 | | 4/2007 |
| DE | 4241045 | | 12/1992 |
| DE | 10233399 | | 2/2003 |
| DE | 10293414 | | 3/2007 |
| EP | 1263035 | * | 4/2002 |
| EP | 1786485 | | 5/2007 |
| GB | 2395799 | | 6/2004 |
| JP | 59200419 | | 11/1984 |
| JP | 3043185 | | 2/1991 |
| JP | 8288195 | | 11/1996 |
| JP | 2001220159 | | 1/2001 |
| JP | 2002072497 | | 3/2002 |
| JP | 2005043777 | | 2/2005 |
| JP | 2006315033 | | 11/2006 |
| JP | 2008126370 | | 6/2008 |
| KR | 1020060030717 | | 3/2006 |
| WO | 0046641 | | 8/2000 |
| WO | 03001869 | | 1/2003 |
| WO | 03012549 | | 2/2003 |
| WO | 2005077013 | | 8/2005 |
| WO | 2008062634 | | 5/2008 |
| WO | 2009094009 | | 7/2009 |

OTHER PUBLICATIONS

H. Xiao, Introduction to Semiconductor Manufacturing Technology, published by Prentice Hall, 2001, ISBN 0-13-022404-9, pp. 328-335.*

Yasuhisa Inao, Near-field lithography as prototype nano-fabrication tool, Science Direct, Microelectronic Engineering 84 (2007) pp. 705-710.

Jing Zhao; Localized Surface Plasmon Resonance Viosensors, Nanomedicine 2006, 1(2), p. 219-228.

Peter Forbes; Self-Cleaning Materials: Lotus Leaf-Inspired Nanotechtechnology, Scientific American, Jul. 30, 2008.

Michael Berger; Moth Eyes Self-Cleaning Antireflection Nanotechnology Coatings, Nanowerk, 2008.

D Schaadt; Enhanced Semiconductor Optical Absorption Via Surface Plasmon Excitation in Metal Nanoparticles, Appl.Phys.Lett, 86,063106, 2005.

S Price; Addressable, Large-Area Nanoscale Organix Light-Emitting Diodes, Small, 2007, 3, No. 3, p. 372-374.

S Pillai; Surface Plasmon Enhanced Silicon Solar Cells, J.Appl.Phys, 101, 093105 (2007).

D Derkacs; Improved Performance of Amorphous Silicon Solar Cells Via Scattering From Surface Plasmon Polaritons in Nearby Metalic Nanoparticles, Appl.Phys.Lett, 89, 09310, year 2006.

Zhaoning Yu; Fabrication of Large Area Subwavelength Antireflection Structures on Si Using Trilayer Resist Nanoimprint Lithography and Liftoff, J.Va.Sci.Techn B21(6), year 2003.

Guoyong Xie; The Fabrication of Subwavelength Anti-Reflective Nanostructures Using a Bio-Template, Nanotechnology 19(2008) 095605, p. 1-5.

Paul Roach; Progress in Superhydrophobic Surface Development, Soft Matter, 2008, 4, p. 224-240.

Bruce Mcleaod; Thin-Films-Motheye Surfaces Reflect Little Light, Laser Focus World, Diplay Article (36357), year 2009.

J Wang; Dewetting of Conducting Polymer Inkjet Droplets on Patterned Surface, Nature Materials, V.3, Mar. 2004, p. 171-176.

L Creagh; Inkjet Printed Electronics: Moving to Production, Printed Electronics USA, Nov. 13-14, 2007, San Francisco, CA.

Stephen Y Chou, Peter R Krauss, Preston J Renstrom; Imprint Lithography With 25-Nanometer Resolution, Science Apr. 5, 1996, vol. 272, No. 5258, p. 85-87.

J.A. Maria A, S.Jeon A, J. Rogers; Nanopatterning With Conformable Phase Masks, Journal of Photochemistry and Photobiology A: Chemistry 166 (2004) 149-154.

Cui, B.; Fabrication of Large Area Nanoprism Arrays and Their Application for Surface Enhanced Raman Spectroscopy, Nanotechnology, vol. 19, No. 14, p. 145302 (6 pages), year 2008.

Xiangang Luo; Subwavelength Photolithography Based on Surface-Plasmon Polariton Resonance, Opt. Soc. America, Jul. 12, 2004, Optics Express, vol. 12, No. 14, USA.

Kik, P.G.; Metal Nanoparticle Arrays for Near-Field Optical Lithography, Proceeding of the SPIE—the International Society for Optical Engineering, 2002, vol. 4810, p. 7-13, USA.

Kik, P.G.; Plasmon Priniting—A New Approach to Near-Field Lithography, Nanopatterning—From Ultralarge-Scale Integration to Biotechnology (Materials Research Society Symposium Proceedings vol. 705), 2002, p. 101-6, USA.

Lin, H.; Localized Surface Plasmon Resonance of Metal Nanodot Nanowire Arrays Studied By Far-Field and Near-Field Optical, National Tsing Hua University, Hsinchu (Taiwan) Department of Materials Science and Engineering, Sep. 5, 2007, Taiwan.

Srituravanich, W,; Sub-100 Nm Lithography Using Ultrashort Wavelength of Surface Plasmons, American Institute of Physics Inc., Dec. 1, 2004, USA.

Sheridan, A.K.; Fabrication and Tuning of Nanoscale Metallic Ring and Split-Ring Arrays, Journal of Vacuum Science & Technology B (Microelectronics and Nanometer Structures), Nov. 2007, vol. 25, No. 6, p. 2628-31, USA.

Takeda, Y.; Surface Plasmon Resonance of Au Nanoparticles Fabricated by Negative Ion Implantation and Grid Structure Toward Plasmonic Applications, Optical Review, Jul.-Aug. 2006, vol. 13, No. 4, p. 231-4, Japan.

Xiangang Luo; Suface Plasmon Resonant Interference Nanolithography Technique, Applied Physics Letter, Jun. 7, 2004, vol. 84, No. 23, p. 4780-2, USA.

Shvets, G.; Applications of Surface Plasmon and Phonon Polaritons to Developing Left-Handed Materials and Nano-Lithography, Proceeding of the SPIE the International Society for Optical Engineering, Nov. 3, 2003, vol. 5221, No. 1, p. 124-32, USA.

McNab, S.J.; Effects of Mask Materials on Near Field Optical Nanolithography, Nanopatterning From Ultralarge-Scale Integration to Biotechnology (Materials Research Society Symposium Proceedings vol. 705), 2002, p. 107-12, USA.

Yang, Yong; Nanolithography in Evanescent Near Field by Using Nano-Filmed Noble Metals Layers, SPIE, Dec. 1, 2007, China.

Sefa-Ntiri, B.; Embedded Metal Mask Enhanced Evanescent Near Field Optical Lithorahy, Proceedings of the 32nd International Conference on Micro-and Nano-Engineering, May 10, 2007, United Kingdom.

Blaber, M.G.; Plasmon Absorption in Nanospheres: A Comparsion of Sodium, Potassium, Aluminium, Silver and Gold, Elsevier, May 15, 2007, Australia.

Xiangang Luo; Subwavelength Photolithography Based on Surface-Plasmon Polariton Resonance, Optical Society of America, Oct. 11, 2004, Optics Express, USA.

Ducker, R.E.; One-Step Photochemical Introduction of Nanopatterned Protein-Binding Functionalities to Oligo (Etylene Glycol)-Terminated Self-Assembled Monolayers, Journal of the American Chemical Society, Dec. 5, 2007, V 129, N 48, P14842+, USA.

Lee, Hyesog; Sub-Diffraction-Limited Optical Imaging With Superlens and Hyperlens, University of California, Los Angeles, vol. 6809B of Dissertation Abstracts International, p. 6252 (118 pages), ISBN: 978-0-549-23309-1, 2007, USA.

Pan, Shanlin; Surface Plasmon Resonance Enhanced Photoluminescence and Applications in Organic Electronics, University of Rochester, vol. 6709B of Dissertations Abstracts International, p. 5095 (186 pages), ISBN: 978-0-542-84717-2, 2006, USA.

Brolo, A.G.; The Development of Surface-Plasmon Sensors Using Arrays of Sub-Wavelength Holes, Proceedings of SPIE, the International Society for Optical Engineering, 2005, USA.

International Search Report and Written Opinion for PCT/US2008/012901 dated Feb. 6, 2009.

Kobrin, Boris; U.S. Appl. No. 60/011,861, filed Jan. 22, 2008.

Chinese First Office Action for Chinese Application No. 200880124519.3 dated Jul. 15, 2011.

Junghoon Yeom, "Maximum achievable aspect ratio in deep reactive ion etching", J. Vac. Sci. Techn., B, v. 23, No. 6, 2005, p. 2319-2329.

C. Craigie, "Polymer thickness effects on Bosch etch profiles", J. Vac. Sci. Techn., B, v. 20, No. 6, 2002, p. 2229-2232.

M. Puech, "A Novel plasma release process and super high aspect ratio process using ICP etching got MEMS", Alcatel Vacuum Technology website: www.adixen.com, Year 2003.

Martin Walker, "Comparison of Bosch and cryogenic processes for patterning high aspect ratio features in silicon", SPIE, v. 4407, 2001, p. 88-99.

Yi Zhao, "Creating Silicon nanostructures with controllable sidewall profiles by using fluorine-enhanced oxide passivation", uTAS2006, Nov. 2006, Japan.

\* cited by examiner

METHOD AND APPARATUS FOR ANISOTROPIC ETCHING

This application claims the benefit of U.S. Provisional Application No. 60/933,989, filed Jun. 9, 2007 and PCT/US2008/006355, filed May 17, 2008. This application is a continuation-in-part of International Application No. PCT/US2008/006355, filed May 17, 2008, which claims the benefit of Provisional Application No. 60/933,989, filed Jun. 9, 2007.

FIELD

This invention relates to a method for etching a substrate in an anisotropic manner. In particular, although, not exclusively, the method and apparatus relate to anisotropic etching of nanosize features with high aspect ratios in a substrate.

BACKGROUND

A method of anisotropic etching of silicon by cyclic etch and deposition steps in a plasma environment is known as "Bosch process" from German patent DE4241045, issued 5 Dec. 1992 and U.S. Pat. No. 5,501,893, issued 26 Mar. 1996, titled "Method of anisotropically etching silicon". This anisotropic plasma etching has been applied to other materials such as Ge, SiGe and GasAs.

When etching high-aspect-ratio silicon features using the "Bosch process" (DRIE--deep reactive ion etching), researchers found that there is a maximum achievable aspect ratio, "critical aspect ratio", of an etched silicon trench. At this critical aspect ratio, the apparent etch rate defined as the total depth etched divided by the total elapsed time no longer monotonically decreases as the aspect ratio increases, but abruptly drops to zero.

Junghoon Yeom, et al, in the paper titled "Maximum achievable aspect ratio in deep reactive ion etching of silicon due to aspect ratio dependent transport and the microloading effect", J. Vac. Sci. Technol. B, Vol. 23, No. 6, November/December 2005, 2319-2329, proposed a theoretical model to predict the critical aspect ratio and reveal its causal mechanism. The model considers aspect ratio dependent transport mechanisms specific to each of the reactant species in the three subprocesses of a time-multiplexed etch cycle: deposition of a fluorocarbon passivation layer, etching of the fluorocarbon polymer at the bottom of the trench, and the subsequent etching of the underlying silicon. The model predicts that the critical aspect ratio is defined by the aspect ratio at which the polymer etch rate equals the product of the deposition rate and the set time ratio between the deposition and etching phases for the time-multiplexed process. Several DRIE experiments were performed to qualitatively validate the model. Both model simulations and experimental results demonstrate that the magnitude of the critical aspect ratio primarily depends on (i) the relative flux of neutral species at the trench opening, i.e., the microloading effect, and (ii) aspect ratio dependent transport of ions during the polymer etching subprocess of a DRIE cycle.

This result means that thick sidewall passivation layers limit "critical aspect ratio" achievable with DRIE process. This effect becomes especially important for nanosize structures where high aspect ratio feature etch requires extremely thin passivation layers.

C. Craigie et al, in the paper titled, "Polymer thickness effects on Bosch etch profiles", J. Vac. Sci. Technol. B 20.6., November-December 2002, 2229-2232, reported thick polymer films developing on Bosch etched features as a result of both long deposition times and high $C_4F_8$ flow rates. Polymer builds up on the sidewalls of trenches. Where polymer thickness is a significant proportion of the trench width, the incident ion flux is restricted. Narrow trenches converge more rapidly than wide ones, as a greater proportion of the width is obscured.

The regular thickness of sidewall polymer passivation layers in state-of-the-art DRIE process is larger than 1000 Å, as reported by J. Reimers et al in the Danish technical Institute Report titled "Fabrication of a Microfluidic System for Magnetic Separation using Deep Reactive Ion Etching", 2004. In some cases such sidewall polymers are reported in micrometer ranges, for example in abovementioned paper of C. Craigie. Alcatel Vacuum Technology at the website, www.adizen.com (M. Puech, et al, "A Novel Plasma Release Process and Super High Aspect Ratio Process using ICP Etching got MEMS") proposed so called "SHARP" process (Super High Aspect Ratio Process), consisting of inserting a specific passivation removal step by oxygen plasma. This passivation removal process is 5 times faster than traditional $SF_6$-based process step. It was demonstrated that this special passivation layer removal step, performed prior to etching step, allowed to achieve aspect ratio etch as high as 60.

Martin Walker from Oxford Technology in the paper titled "Comparison of Bosch and cryogenic processes for patterning high aspect ratio features in silicon", published in Proceedings of SPIE, Volume 4407, MEMS Design, Fabrication, Characterization, and Packaging, April 2001, pp. 89-99, describes another problem with Bosch passivation process, when it is applied to high aspect ratio feature etch: As the ratio of depth to width increases, so the attack on the sidewalls due to ion bombardment becomes less. This can result in build-up of polymer, resulting in negative profiles if it occurs at the top of the hole, or the formation of grass when it occurs at the bottom etched surface.

The same author describes so called "cryo" process as an alternative to Bosch process. Just as for the Bosch process, this technique also uses $SF_6$ to provide fluorine radicals for silicon etching. The silicon is removed in the form of $SiF_4$, which is volatile. The main difference is in the mechanism of sidewall passivation and mask protection. Rather than using a fluorocarbon polymer, this process relies on forming a blocking layer of oxide/fluoride ($SiO_xF_y$) on the sidewalls (around 10-20 nm thick), together with cryogenic temperatures inhibiting attack on this layer by the fluorine radicals. The low temperature operation also assists in reducing the etch rate of the mask material, which is normally either photoresist or silicon dioxide. The attack on these materials by free radical fluorine is chemical in nature and is sensitive to temperature, with the etch rate dropping rapidly at cryogenic temperatures. The low temperature can have a bad effect on some organic materials, causing cracking. This is more severe for thicker photoresists than for thin layers. As a rough guideline, layers of resist used for this process should not be more than 1.5 µm thick, to avoid the hazard of cracking.

Yi Zhao et al, in the paper titled "Creating Silicon nanostructures with Controllable Sidewall Profiles by Using Fluorine-Enhanced Oxide Passivation", The 10th International Conference on Miniaturized Systems for Chemistry and Life Sciences (uTAS2006), Nov. 5-9, 2006, Tokyo, Japan, suggested an alternative to the "cryo" process by alternating reactive ion etching and air exposure: During plasma etching, F being adsorbed on the surface breaks preexisting Si—O bonds and form Si—F group, thus forming a $SiO_xF_y$ layer. When exposed to the coexistence of oxygen and moisture, the Si—F groups are quickly replaced by Si—OH groups from the water vapor ambient due to the similar ionicity. The Si—OH groups bridge and form layers of oxide. The oxide continues to grow due to field assisted Mott-Cabrera mechanism. The fluorine-enhanced oxide layer postpones the attack of the sidewalls during the following brief plasma etching. The sidewall passivation is thus enabled. Obviously, control of sidewall passivation layer thickness and uniformity is very problematic with this method.

Suk Won Yu has used dielectric etch preventing spacer deposited on the sidewall of the etched feature in KR 10-2006-0030717. Unfortunately, due to the chosen deposition method such spacer is quite thick and non-uniform along the length of the sidewall feature, as it clearly seen from the patent's text and the drawing. Mr. Yu does not teach how to get uniformly deposited sidewall passivation layer, which will be thin enough and uniform enough for nano-sized features with high aspect ratio.

SUMMARY

We suggest a method of anositropic etching of the substrates, where ultra-thin and conformable layers of materials are used to passivate sidewalls of the etched features.

According to an exemplary embodiment such sidewall passivation layer is a Self-assembled monolayer (SAM) material deposited in-situ etching process from a vapor phase.

According to another exemplary embodiment such sidewall passivation layer is an inorganic-based material deposited using Atomic Layer Deposition (ALD) method.

SAM or ALD layers deposition can be carried out in a pulsing regime alternating with an etching or sputtering processes using process gasses with or without plasma. Alternatively, a SAM deposition process is carried out continuously, while an etch or sputtering process turns on in a pulsing regime. Alternatively, a SAM deposition process and etch or sputtering processes are carried out continuously.

Both types of suggested passivation materials give advantages over state-of-the-art methods in ability to carefully control thickness and uniformity of the layers, and thus enable extending achievable high aspect ratio and narrow nanosize feature anisotropic etching process.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

The present invention solves the problems associated with thickness and uniformity of sidewall passivation layers and enables successful high-aspect ratio anisotropic etch of micro and, especially, nanostructures.

In accordance with the first embodiment of the present invention, passivation polymer is deposited from the vapor phase in the form of self-assembled monolayer (SAM).

Figure 1:
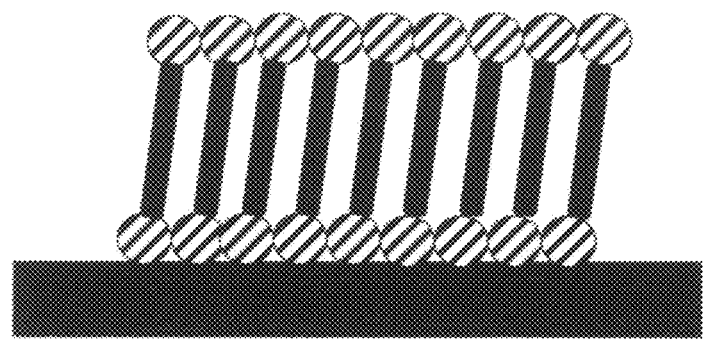
FIG. 1 shows a schematic representation of Self-assembled Monolayer (SAM). Deposition of these layers is self-limiting (deposition stops when entire surface is filled with one layer of molecules), thus thickness of this layer is always equal to the one molecular length (practical thickness range is 0.5-3 nm) and uniformity of deposited layer is 100%.

Self-assembled monolayers (FIG. 1) are arrays of aligned molecules, which have so called, a "head group", used to attach molecule to the substrate using covalent or other bonding, organic "backbone", and a "tail" group, which may have different properties (hydrophobic, hydrophilic, etc. Deposition process is self-limiting; it stops once the entire surface is covered with SAM, since the second layer of SAM can not be attached to the first. It means that SAM can not be accumulated on the sidewall and the thickness of such passivation layer on the sidewalls of the etched feature is the same through entire etch process. Uniformity of the deposition is excellent, since thickness is equal to the height of a single molecule (0.5-3 nm). FIG. 1 shows schematic representation of SAM, where ordered and self-aligned molecules are formed on the surface.

SAM can be easily removed (sputtered) from the bottom of the feature using low energy ion bombardment, but SAM protects sidewalls of the feature from being etched, thus provides high anisotropy of the etch process.

Though self-assembled monolayers are very thin, they proved to be useful masking materials for wet etch. Buchwalter et al. in the patent application US20030211341, filed Nov. 13, 2003, and titled "Self-assembled Monolayer Etch barrier for Indium-Tin-Oxide Useful in manufacturing Thin Film Transistor-Liquid Crystal display, used n-alkylsilanes monolayers as an etch masks for ITO (indium-titanium-oxide) etch by wet solution of 3.5% aqueous oxalic acid during 5 min (which etched 500 A of unmasked ITO). M. Geissler et al in the paper titled "Selective wet-etching of microcontact-printed Cu substrates with control over etch profile", Microelectronic Engineering, v.67-68, N1, June 2003, p. 326-332, used SAMs as an etch masks for Cu etch, and T. Komeda et al in the paper titled, "Octadecyltrichlorosilane self-assembled monolayer islands as a self-patterned-mask for HF etching of SiO2 on Si.", J. Vac. Sci & Tech., A16, N3, May 1998, p. 1680-1685, used Octadecyltrichlorosilane (OTS) SAM as an etch mask for Hydrofluoric acid etch of SiO2 material.

Utilization of self assembled monolayers as an etch masks for dry (plasma) etch has been more problematic, because of the selectivity issues: these layers are too thin and get etched fast, which does not allow receiving significant etch depth of unmasked regions of the substrate. Yet, it has been reported some resistance of OTS (Octadecyltrichlorosilane) against $Cl_2$ plasma with 400 W microwave power at low pressures (2 mTorr), as shown in the paper of M. J. Lercel et al, titled "Pattern transfer of electron beam modified self-assembled monolayers for high-resolution lithography", J. Vac. Sci &

Tech., B13, N3, May 1995, p. 1139-1143. The layer retained hydrophobicity after 8 s exposure to this plasma conditions.

The current invention declares that Self-assembled Monolayers (SAMs) deposited on the sidewalls of the masking material and etched feature (trench, hole, etc.), which are not experiencing direct ion bombardment from Reactive Ion Etch plasma, are able to protect them from etch. Moreover, parts of SAM passivation layer damaged by grazing ion collisions or ion backscattering from the bottom of the trench can be "healed" with consecutive SAM deposition steps. Again, thickness of the "healed" layer still will not exceed one monolayer. Thus, SAMs can be successfully used as a sidewall passivation layers in anisotropic etch.

SAM deposition can be accomplished using a wide variety of organic precursors. Some examples of them are: Octadecyltrichlorosilane (OTS), Octyltrichlorosilane (OTCS), Dodecyltrichlorosilane (DDTCS), dimethyldichlorosilane (DDMS), tridecafluoro-1,1,2,2-tetrahydrooctyltrichlorosilane (,FOTS), heptadecafluoro-1,1,2,2-tetrahydrodecyltrichlorosilane (FDTS), (tridecafluoro-1,1,2,2,-tetrahydrooctyl)trisdimethylamino silane (PF8TAS), (heptadecafluoro-1,1,2,2,-tetrahydrodecyl)tris-dimethylamino silane (PF10TAS). Some precursors, like chlorosilanes, require, catalyst (water vapour or ozone gas), and others, like aminosilanes, can be used without catalyst.

Figure 2:
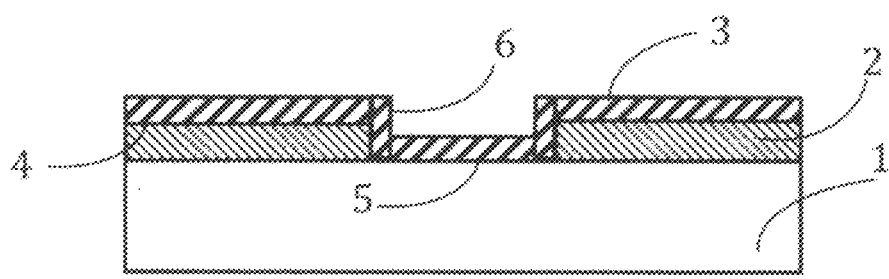
FIG. 2 is a schematic which shows the status after the SAM or ALD-material deposition step: substrate 1 is covered with patterned photoresist 2, and then SAM or ALD-material layer 3 deposited on top of both, photoresist 4 and exposed substrate material 5.

Referring to FIG. 2, substrate 1 is patterned with etch mask 2 using one of the known patterning techniques. Etch mask can be, for example, photoresist material.

In accordance with the first embodiment, during the first process step entire surface of the substrate is covered with SAM passivation layer 3, which includes mask (photoresist) horizontal surfaces 4, sidewalls of the patterned feature 6, and exposed areas of the substrate 5.

In accordance with another embodiment of the present invention thin inorganic films are used as a sidewall passivation layers. Such films can be deposited using well-known Atomic Layer Deposition techniques, wherein two vapors or gases are sequentially injected into the vacuum chamber and pumped from it, which builds a very conformal material over substrate surface, layer-by-layer. Very thin ALD deposited films can provide necessary passivation of sidewalls against etching species and, since ALD films are very thin, can be easily sputtered by directional ion beam of the biased plasma during etching step of the process.

Example of such passivation film is aluminum oxide, which can be grown by sequential introduction to the chamber Trimethylaluminum (TMA) and water vapor or ozone gas. Another example is titanium oxide, which can be grown by sequential introduction to the chamber titanium tetrachloride and water vapor. ALD deposition of these films at low temperatures (room to 100 C) can be done at rates about 1-5 Å/cycle.

Figure 3:
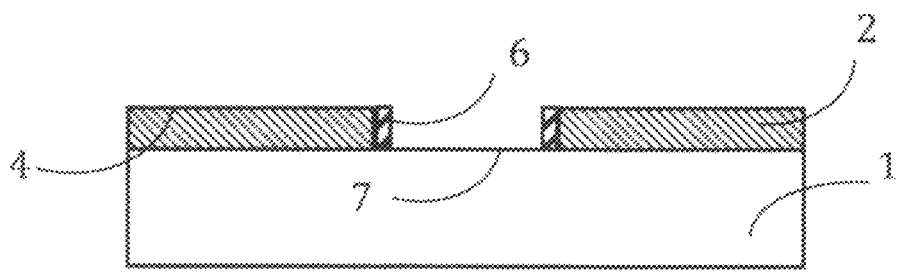
FIG. 3 is a schematic which shows the status after the first etching or sputtering step: SAM or ALD-material layer is etched or sputtered from the horizontal areas of the photoresist 4 and substrate material 5, but remains on the sidewall of the photoresist feature 6

During the second process step, shown on FIG. 3, plasma ions, created by known reactive ion etching methods (RIE, ICP, TCP, etc.) in the presence of gasses (for example, Ar, He, etc.), directed towards the substrate surface, sputter or etch SAM or ALD-type passivation layer from the horizontal surfaces 4 of the mask material 2 and exposed area 5 of substrate material 1. Since during the biased plasma process the ions are moving vertically downward, they can make only grazing collisions with the self-assembled monolayer on the sidewalls resulting in removal of just the SAM or ALD-type passivation layer at the base of the feature (horizontal surfaces 5), leaving this layer on the sidewalls 6 intact. Passivation layer 6 protects sidewall of the mask material 2 from being eroded during following sputtering and etching steps, thus helps to preserve critical dimension of the etched feature and enabling high aspect ratio etching process.

In accordance with another embodiment of the present invention removal of SAM passivation layer from the bottom of the etched feature is done UV exposure, preferably in an ambient of ozone or oxygen, or moisture. SAMs are efficiently etched by UV exposure in the presence of ozone. UV exposure can be implemented by providing a UV lamp or Laser and directing a light beams or collimated beam into the chamber toward the substrate material, preferably normal to the substrate surface.

Figure 4:
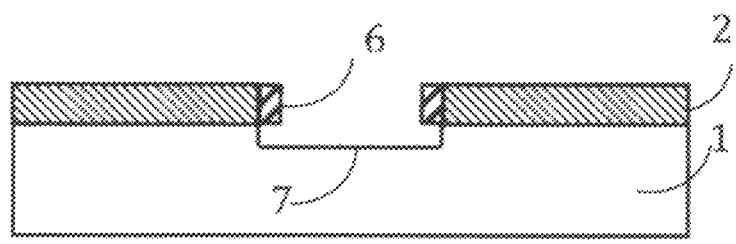
FIG. 4 is a schematic which shows the status after the main etching step: substrate material is etched into the bulk 7. This will end the first cycle. The same 3 steps then repeated certain amount of time to get the desired etch depth
Figure 5:
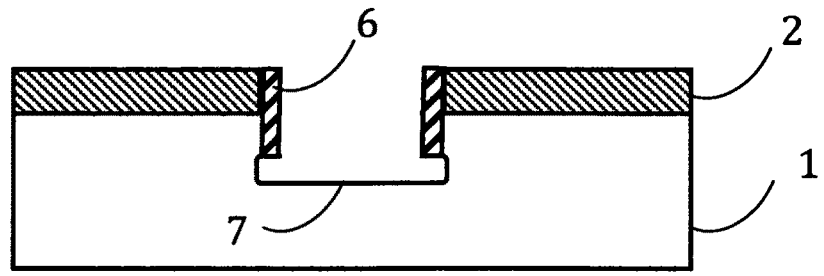
FIG. 5 is a schematic which shows the status after the second cycle.

The third process step is an etching of exposed area 5 of the substrate material 1, which creates (increases) feature depth 7 (FIG. 4). Again, the etching can be done any known dry etching process (RIE, ICP, TCP or other types of plasma etch process) with set of gasses appropriate for etching of specific substrate material. For example, for Si etch one can chose perfluorinated gases $SF_6$, for oxides etch it is $CHF_3$ or $CF_4$.

In accordance with another embodiment of the present invention etching of substrate material is performed with non-plasma etching means, for example, $XeF_2$ etch for Si or Ge, or anhydrous vapor HF etch for oxides.

Figure 6:
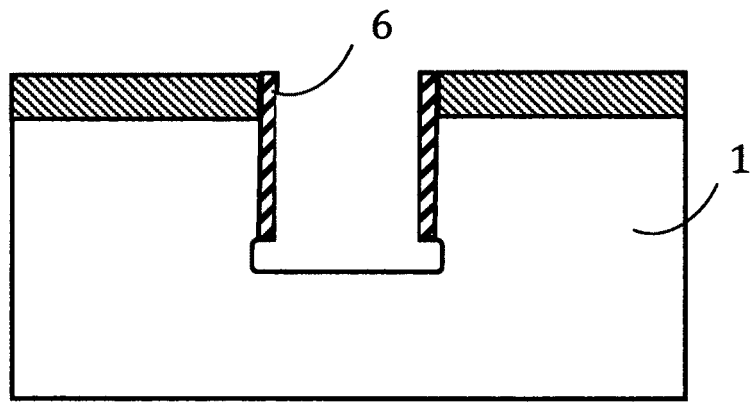
FIG. 6 is a schematic which shows the status after completion of the entire etch process: substrate feature is etched to the desired depth, sidewalls are still protected with SAM or ALD-material layer deposition

The cycle of the described three process steps is repeated again, and at the end of the second cycle of the process (FIG. 6), sidewalls of mask material and the etched feature are covered with SAM or ALD-type passivation layer 6 protecting etched feature dimension.

Figure 7:
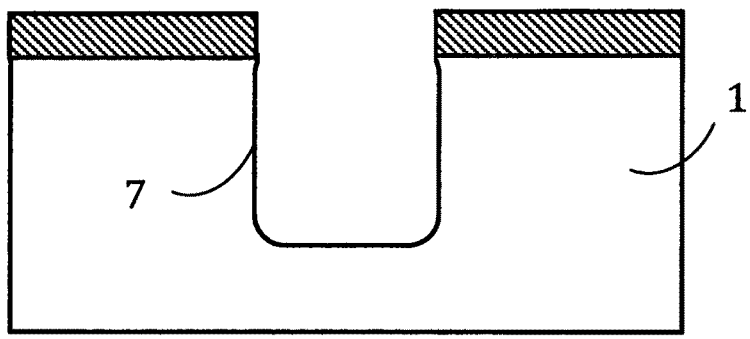
FIG. 7 is a schematic which shows the status after optional SAM or ALD-material layer stripping from the sidewall of the feature.

The etch cycles include the above three process steps (passivation layer deposition, passivation layer etch from the horizontal surfaces, and etch of the substrate material) continues further until the substrate is etched to the desired depth (FIG. 7).

Remaining SAM can be etched from the sidewalls of the etched feature using oxygen plasma or ozone, or special wet stripping process (FIG. 8).

Remaining ALD-type passivation layer can be etched from the sidewalls of the etched feature using vapor or liquid etching processes. For example, ALD oxide can be etched using HF vapor or liquid processes (FIG. 8).

In accordance with another embodiment of the present invention the second and the third process steps are performed simultaneously, that is, removal of SAM or ALD-type passivation layer from the bottom of the etched feature is done simultaneously with material etch, using the same process. In this case parameters of plasma etching process are modified to provide some directionality (anisotropy) of etch. Usually it is done by providing some bias to the plasma to increase ion directionality towards the substrate surface.

In accordance with another embodiment of the present invention SAM or ALD-type layer deposition is carried out without interruption, but sputtering or etching it from the bottom of the etched feature, and etching of substrate material—are performed in pulsing or cycling regime. SAM or ALD-precursor vapors are injected or flown into the vacuum chamber all the time, but etching gasses are injected or flown into the chamber during short periods with certain interruption time for deposition only process. This way SAM or ALD-type layer deposition process may create more continuous layer on the surface and better protect it from etching.

In accordance with another embodiment of the present invention all 3 steps—passivation layer deposition, sputtering or etching it from the bottom of the etched feature, and etching of substrate material—are performed simultaneously, without interruptions or cycling: SAM or ALD-precursor vapors are injected or flown into the vacuum chamber along with the gases for etching. Varying specific process parameters (namely, partial pressures and plasma bias) allow dynamic equilibrium between growth of passivation layers, their sputtering from horizontal surfaces, and effective material etch to be achieved.

According to a further aspect of the present invention, there is provided an apparatus for performing the method described above, comprising a chamber, means for depositing a passivation layer and means for etching a substrate and passivation layer.

The means for etching the substrate and passivation layer may be provided by supplying one or more reactive gases or vapours to the chamber. For Si material etching it can be $SF_6$ $ClF_3$ $BrF_5$ $XeF_2$, etc. For oxide material etching it can be $CHF_3$, $CF_4$ or other etching gases or anhydrous HF vapour. For SAM or ALD-type passivation layer sputtering can be achieved using biased plasma of Ar, He or other non-reactive gases.

Specific embodiments may include further supplying RF energy (inductively or capacitively coupled via electrodes) or microwave energy to a plasma in the chamber.

The means for depositing a passivation layer in the form of SAM or ALD-type layers may be provided by injecting vapours to the chamber by evaporation of liquid or solid chemical precursor, stored in a precursor supply cylinder or bottle. Alternatively, vapours can be carried from the precursor supply bottle with a help of carrier gas, for example, nitrogen.

EXAMPLE ONE

For the purpose of illustration of possible implementations of the invention, here is a specific embodiment of anisotropic etch of Si material.

Step-1: Deposition step: SAM passivation layer is deposited by flowing vapor of (heptadecafluoro-1,1,2,2,-tetrahydrodecyl)tris-dimethylamino silane into the chamber at a partial pressure of 100-500 mTorr for 5-30 seconds, and then evacuating chamber to the base pressure.

Step-2: SAM etching from the bottom of the trench step: ICP plasma of $SF_6$ with addition of Ar (for example, ratio 2:1) and small plasma bias (electrode power 5-20W). 1-3 seconds of exposure to this plasma conditions should be enough to etch any SAM layer from horizontal surfaces.

Step-3: Si material etch step: 5-10 seconds of $SF_6$ (100-200 sccm flow range)/Ar (30-80 sccm flow range) plasma, ICP coil power 600-900 W, bias 5-10 W.

Steps 1-3 are repeated until desired feature depth is reached.

EXAMPLE TWO

For the purpose of illustration of possible implementations of the invention, here is a specific embodiment of Si material anisotropic etch.

Deposition step: SAM passivation layer is deposited during entire etch process by flowing vapor of (heptadecafluoro-1,1,2,2,-tetrahydrodecyl)tris-dimethylamino silane into the chamber at a partial pressure of 100-500 mTorr SAM etching from the bottom of the trench step and Si etching are carried out in a pulsing regime, 1-3 s ON, 3-5 s OFF. Parameters of this step: SF6 (100-200 sccm flow range)/Ar (30-80 sccm flow range) plasma, ICP power 600-900 W, bias 5-10 W.

Process per above is continued until desired feature depth is reached.

EXAMPLE THREE

For the purpose of illustration of possible implementations of the invention, here is a specific embodiment of Si material anisotropic etch.

Step-1: Deposition step: $Al_2O_3$ passivation layer is deposited by flowing vapor of Tetramethylaluminum (TMA) into the chamber for 0.5-1 s at a partial pressure of 50-200 mtorr, then evacuating the chamber to the base pressure, purging chamber with Nitrogen for 1-2 s, then injecting ozone gas for 0.5-1 s, evacuating chamber to base pressure and purging it with Nitrogen for 1-2 s. Then, by repeating this cycle 5 times, 7-10 Å of $Al_2O_3$ is grown on substrate surface.

Step-2: $Al_2O_3$ sputtering from the bottom of the trench step: ICP plasma of $SF_6$ with addition of Ar (for example, ratio 2:1) and small plasma bias (electrode power 5-20 W). 1-3 seconds of exposure to this plasma conditions should be enough to sputter 10 Å of $Al_2O_3$ from horizontal surfaces.

Step-3: Si material etch step: 5-10 seconds of $SF_6$ (100-200 sccm flow range)/Ar (30-80 sccm flow range) plasma, ICP coil power 600-900 W, bias 5-10 W.

Steps 1-3 are repeated until desired feature depth is reached.

EXAMPLE FOUR

For the purpose of illustration of possible implementations of the invention, here is a specific embodiment of Si material anisotropic etch.

Step-1: Deposition step: SAM passivation layer is deposited by flowing vapours of (heptadecafluoro-1,1,2,2,-tetrahydrodecyl)tris-dimethylamino silane into the chamber at a partial pressure of 100-500 mTorr for 5-30 s, and then evacuating chamber to the base pressure.

Step-2: SAM etching from the bottom of the trench step: RIE plasma of Ar (partial pressure 200-500 mTorr) and small plasma bias (electrode power 10-20 W). 1-3 seconds of exposure to this plasma conditions should be enough to etch any SAM layer from horizontal surfaces.

Step-3: Si material etch step: 5-10 seconds of $XeF_2$ (1.4 Torr partial pressure)

Steps 1-3 are repeated until desired feature depth is reached.

EXAMPLE FIVE

For the purpose of illustration of possible implementations of the invention, here is a specific embodiment of Quartz material anisotropic etch.

Step-1: Deposition step: $Al_2O_3$ passivation layer is deposited by flowing vapor of Tetramethylaluminum (TMA) into the chamber for 0.5-1 s at a partial pressure of 50-200 mTorr, then evacuating chamber to the base pressure, purging chamber with Nitrogen for 1-2 s, then injecting ozone gas for 0.5-1 s, evacuating chamber to base pressure and purging it with Nitrogen for 1-2 s. Then, by repeating this cycle 5 times, 7-10 Å of $Al_2O_3$ is grown on substrate surface.

Step-2: $Al_2O_3$ sputtering from the bottom of the trench step: RIE plasma of Ar (200-500 mTorr partial pressure) and small plasma bias (electrode power 10-20 W). 1-3 seconds of exposure to this plasma conditions should be enough to sputter 10 Å of $Al_2O_3$ from horizontal surfaces.

Step-3: Silicon oxide material etch step: 5-10 seconds of anhydrous HF vapor HF/$CH_3OH$) mixture 3-8 Torr partial pressure, 25:1 ratio).

Steps 1-3 are repeated until desired feature depth is reached.

We claim:

1. A method of treating a substrate material or film present on a material surface comprising: (a) depositing a passivation layer on the surfaces of an etched feature and masking material as a self-assembled monolayer (SAM), wherein a thickness of the passivation layer on a sidewall of the etched feature is less than 3 nm, wherein the passivation layer is a self-assembled monolayer (SAM), (b) removing the passivation layer from horizontal areas of the mask material and bottom of the etched feature, and (c) etching the substrate material to increase the depth of the etched feature, while the passivation layer on the sidewall protects the sidewall of the etched feature from being etched.

2. A method according to claim 1, wherein the SAM passivation layer is a silane compound.

3. A method according to claim 2, wherein the silane compound is alkylsilane or aminosilane.

4. A method according to claim 1, wherein step b) is done using ion bombardment.

5. A method according to claim 1, wherein step b) is done using UV light exposure.

6. A method according to claim 1, wherein step c) is done using a plasma etch process.

7. A method according to claim 1, wherein step c) is done using HF vapors or anhydrous HF vapors mixed with alcohol vapors.

8. A method according to claim 1, wherein step c) is done using exposure to $XeF_2$ vapor.

9. A method of treating a substrate material or film present on a material surface comprising: (a) depositing a passivation layer on the surfaces of an etched feature and masking material as a self-assembled monolayer (SAM) or by using an Atomic Layer Deposition process, wherein a thickness of the passivation layer on a sidewall of the etched feature is less than 10 nm, (b) removing the passivation layer from horizontal areas of the mask material and bottom of the etched feature, and (c) etching the substrate material to increase the depth of the etched feature, while the passivation layer on the sidewall protects the sidewall of the etched feature from being etched, wherein b) and c) are performed simultaneously.

10. A method according to claim 9, wherein all 3 steps—a), b) and c)—are done simultaneously until a desired etch depth achieved.

11. The method of claim 9, wherein the passivation layer is a self-assembled monolayer (SAM).

12. A method according to claim 9, wherein said passivation layer is a layer deposited using an Atomic Layer Deposition process (ALD-type layer).

13. A method according to claim 12, wherein said ALD-type layer is a metal oxide, like aluminum oxide, titanium oxide, or silicon oxide, silicon nitride, silicon oxynitride, or metal oxynitride.

14. A method of treating a substrate material or film present on a material surface comprising: (a) depositing a passivation layer on the surfaces of an etched feature and masking material as a self-assembled monolayer (SAM) or by using an Atomic Layer Deposition process, wherein a thickness of the passivation layer on a sidewall of the etched feature is less than 10 nm, (b) removing the passivation layer from horizontal areas of the mask material and bottom of the etched feature, and (c) etching the substrate material to increase the depth of the etched feature, while the passivation layer on the sidewall protects the sidewall of the etched feature from being etched, wherein step a) is performed continuously, and steps b) and c) are done in a pulsing regime, until a desired etch depth achieved.

15. The method of claim 14, wherein the passivation layer is a self-assembled monolayer (SAM).

16. A method according to claim 14, wherein said passivation layer is a layer deposited using an Atomic Layer Deposition process (ALD-type layer).

17. A method according to claim 16, wherein said ALD-type layer is a metal oxide, like aluminum oxide, titanium oxide, or silicon oxide, silicon nitride, silicon oxynitride, or metal oxynitride.

* * * * *